(12) United States Patent
Chang et al.

(10) Patent No.: US 9,230,649 B2
(45) Date of Patent: Jan. 5, 2016

(54) NON-VOLATILE TERNARY CONTENT-ADDRESSABLE MEMORY 4T2R CELL WITH RC-DELAY SEARCH

(71) Applicant: National Tsing Hua university, Hsinchu (TW)

(72) Inventors: Meng-Fan Chang, Hsinchu (TW); Li-Yue Huang, Taichung (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 245 days.

(21) Appl. No.: 14/159,005

(22) Filed: Jan. 20, 2014

(65) Prior Publication Data

US 2015/0206586 A1 Jul. 23, 2015

(51) Int. Cl.
*G11C 15/04* (2006.01)

(52) U.S. Cl.
CPC .................................. *G11C 15/046* (2013.01)

(58) Field of Classification Search
USPC .................................................. 365/49.1, 148
See application file for complete search history.

(56) References Cited

U.S. PATENT DOCUMENTS

| | | | | |
|---|---|---|---|---|
| 6,411,538 B1 * | 6/2002 | Kengeri | ................ | G11C 15/04 365/168 |
| 2008/0117669 A1 * | 5/2008 | Fuji | .................... | G11C 13/0004 365/163 |
| 2013/0054886 A1 * | 2/2013 | Eshraghian | .......... | G11C 15/046 711/108 |
| 2015/0235703 A1 * | 8/2015 | Sakimura | ............... | G11C 15/04 365/49.17 |

\* cited by examiner

*Primary Examiner* — Huan Hoang
*Assistant Examiner* — Minh Dinh
(74) *Attorney, Agent, or Firm* — Li & Cai Intellectual Property (USA) Office (57) ABSTRACT

The 4T2R cell comprises a write transistor, a first variable resistive element, a first transistor, a second variable resistive element, a second transistor, and a charge control transistor. The first transistor is electrically coupled to the first variable resistive element in series, and the second transistor is electrically coupled to the second variable resistive element in series, for providing search paths. For operating in a search phase, a pulse voltage is applied across the gate electrode and the source electrode of the first transistor (or across the gate electrode and the source electrode of the second transistor) for determining whether the gate voltage of the charge control transistor changes larger than a match threshold during the period of the pulse. Different RC-delay of the variable resistive elements controlling the voltage change speed of the gate voltage of the charge control transistor determines the matching result.

20 Claims, 5 Drawing Sheets

| TCAM | SL | SLB | NX (search"1") | NX (search"0") | NL (search"1") | NL (search"0") |
|---|---|---|---|---|---|---|
| 1 | HRS | LRS | <Vth of Mml | >Vth of Mml | VDD | 0V(mismatch) |
| 0 | LRS | HRS | >Vth of Mml | <Vth of Mml | 0V(mismatch) | VDD |
| X | HRS | HRS | <Vth of Mml | <Vth of Mml | VDD | VDD |

NON-VOLATILE TERNARY CONTENT-ADDRESSABLE MEMORY 4T2R CELL WITH RC-DELAY SEARCH

BACKGROUND OF THE INVENTION

1. Field of the Invention

The instant disclosure relates to a ternary content-addressable memory; in particular, to a non-volatile ternary content-addressable memory (TCAM) 4T2R cell with RC-delay search.

2. Description of Related Art

Content-addressable memory (CAM) is a type of computer memory used in high speed searching applications. Content-addressable memory fast compares a string of input data with stored data, and outputs the address of matched data. Binary content-addressable memory is the simplest CAM for storing data with two states including "0" and "1". Ternary content-addressable memory (TCAM) is for storing data for one or more bits in the stored dataword with three states. The first state is "0", the second state is "1" and the third matching state is "X" (or "Don't Care") which means always match.

The conventional ternary content-addressable memory comprises an array (all storage cells; 1 row as 1 entry, 1 column as 1 bit), a decoder for choosing which row to write, a main controller for producing control signals, a data-in circuit for writing data or searching data, a sense amplifier (SA) for sensing compared result and amplifying the result, and an output encoder for transferring the result into address which has matching data. In a write phase, writing data to the storage cell(s). In a search phase, comparing input data with memory content (all data in storage cells), and outputting the address of identical (matching) content.

Figure 1A:
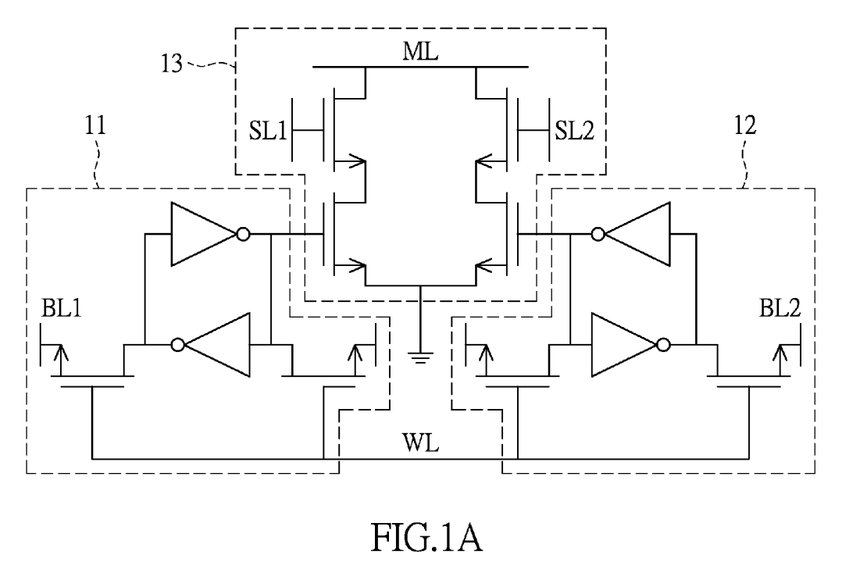
FIG. 1A shows a circuit diagram of a conventional 16T SRAM-based TCAM.
Figure 1B:
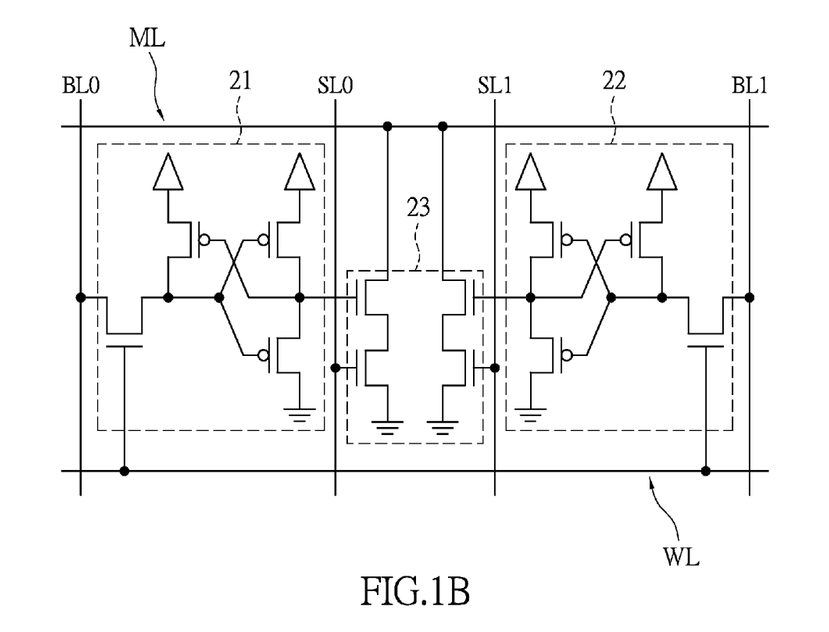
FIG. 1B shows a circuit diagram of a conventional 12T SRAM-based TCAM.

Referring to FIG. 1B and FIG. 1C showing circuit diagrams of the conventional 16T SRAM-based TCAM and 12T SRAM-based TCAM. In FIG. 1A, six transistors constitute a storage part 11 connected to a bit-line BL1 and a word-line WL, six transistors constitute a storage part 12 connected to a bit-line BL2 and the word-line WL, and the compare logic 13 is a NAND logic (or a NOR logic) connected to search-lines SL1, SL2 and a match-line ML. In FIG. 1B, four transistors constitute a storage part 21 connected to a bit-line BL0 and a word-line WL, four transistors constitute a storage part 22 connected to a bit-line BL1 and the word-line WL, and the compare logic 23 is a NAND logic (or a NOR logic) connected to search-lines SL0, SL1 and a match-line ML. For the TCAM shown in FIG. 1A (or FIG. 1B), writing data is similar to the conventional SRAM, in which the state "0" is stored as to (1, 0) (for (SRAM1, SRAM2)), the state "1" is stored as to (0, 1), and the state "X" is stored as to (0, 0). For data search, the compare logic 13 (or 23) connecting the search-data pair and the storage-data pair will discharge the match-line ML if the search-pair is different from the storage-data pair.

However, for non-volatile memory (NVM), read disturb during reading which flips data in the storage cell should be reduced. Read disturb probably happens when large voltage stress is applied to the non-volatile memory or large current passes through the non-volatile memory. Meanwhile, more transistors in each cell occupy more circuit (or chip) area.

SUMMARY OF THE INVENTION

The object of the instant disclosure is to provide a non-volatile ternary content-addressable memory 4T2R cell with RC-delay search.

In order to achieve the aforementioned objects, according to an embodiment of the instant disclosure, a 4T2R is offered. The 4T2R cell comprises a write transistor, a first variable resistive element, a first transistor, a second variable resistive element, a second transistor, and a charge control transistor. The write transistor is controlled by a write-line, and the drain electrode of the write transistor is electrically coupled to a bias voltage. The first variable resistive element is electrically coupled to the source of the write transistor. The first transistor is electrically coupled to the first variable resistive element in series, and controlled by a first search-line. The second variable resistive element is electrically coupled to the source of the write transistor. The second transistor is electrically coupled to the second variable resistive element in series, and controlled by a second search-line. The source electrode of the second transistor and the source electrode of the first transistor are connected together. The charge control transistor is electrically coupling to a match-line for controlling the voltage level of the match-line. The gate electrode of the charge control transistor is electrically coupled to the source of the write transistor the first variable resistive element and the second variable resistive element. When the 4T2R cell operates in a search phase, a pulse voltage is applied across the gate electrode and the source electrode of the first transistor for determining whether the gate voltage of the charge control transistor changes larger than a match threshold during the period of the pulse, and the pulse voltage is applied across the gate electrode and the source electrode of the second transistor for determining whether the gate voltage of the charge control transistor changes larger than the match threshold during the period of the pulse.

In order to achieve the aforementioned objects, according to an embodiment of the instant disclosure, a non-volatile ternary content-addressable memory is offered. The non-volatile ternary content-addressable memory comprises a plurality of aforementioned 4T2R cells.

In summary, the non-volatile ternary content-addressable memory 4T2R cell occupies smaller circuit (or chip) area compared to the conventional TCAM, and provides low current applying to the 4T2R cell to reduce read disturb.

In order to further the understanding regarding the instant disclosure, the following embodiments are provided along with illustrations to facilitate the disclosure of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 2A:
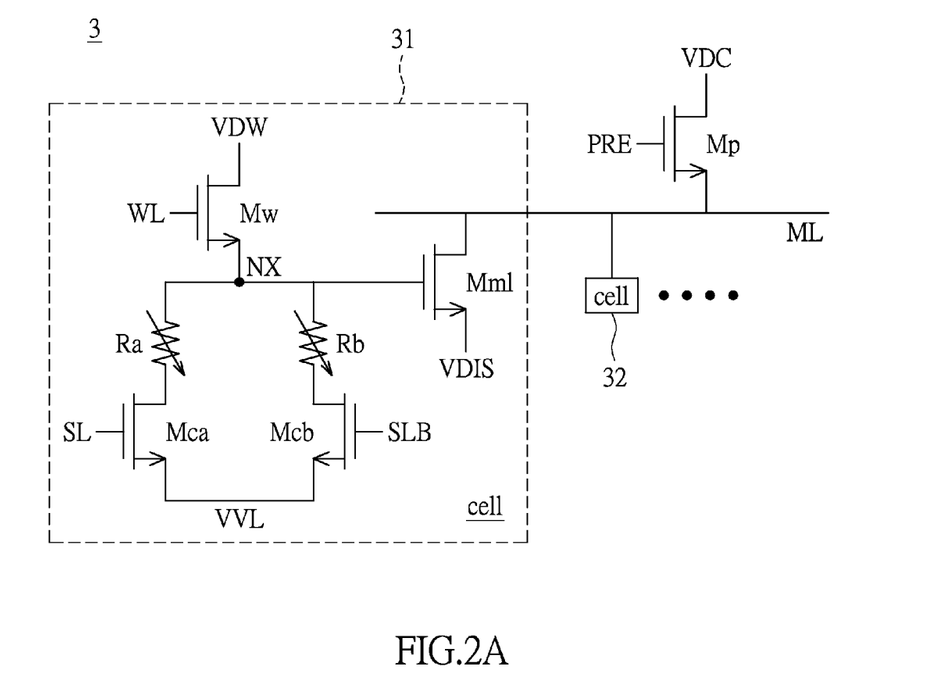
FIG. 2A shows a circuit diagram of a non-volatile ternary content-addressable memory according to an embodiment of the instant disclosure.

Referring to FIG. 2A showing a circuit diagram of a non-volatile ternary content-addressable memory according to an embodiment of the instant disclosure. A non-volatile ternary content-addressable memory 3 comprises a plurality of 4T2R cells 31, 32 . . . etc. The other circuits of the ternary content-addressable memory such as the decoder, the main controller, the sense amplifiers, and the output encoder which are well known by the person skilled in the art is not shown in FIG. 2A, and the related information is omitted. A logic "0", a logic "1" or a logic "X" (don't care) could be stored in the 4T2R cell 31. The plurality of 4T2R cell may be arranged an array, and each 4T2R cell is corresponding to a write-line WL, two search-lines (including a first search-line SL and a second search-line SLB) and a match-line ML. Each 4T2R cell 31 (or 32 . . . etc.) comprises a write transistor Mw, a first variable resistive element Ra, a first transistor Mca, a second variable resistive element Rb, a second transistor Mcb, and a charge control transistor Mml. A precharge transistor Mp connected to a match-line ML is control by a precharge signal PRE, and a bias voltage is provided to the source of the precharge transistor Mp which is a P-channel MOSFET.

In this embodiment, the write transistor Mw, the first transistor Mca, the second transistor Mcb, and the charge control transistor Mml are N-channel MOSFETs. The first variable resistive element Ra and the second variable resistive element Rb are non-volatile elements, in which stored data still remains when power supply is turned off. Non-volatile element can be any type of resistive storage device, such as phase change material (PCM), magnetic tunnel junction (MTJ), or memristor etc. which have been utilized to the phase change random-access memory (PCRAM), the resistive random-access memory (RRAM) or the magnetoresistive random-access memory (MRAM). The first variable resistive element Ra and the second variable resistive element Rb could be treat as programmable resistors both having two distinct electrical resistance values.

The write transistor Mw is controlled by the write-line WL. The drain electrode of the write transistor Mw is electrically coupled to a bias voltage VDW. The first variable resistive element Ra is electrically coupled to the source of the write transistor Mw. The first transistor Mca is electrically coupled to the first variable resistive element Ra in series, and controlled by the first search-line SL. The second variable resistive element Rb is electrically coupled to the source of the write transistor Mw. The second transistor Mcb is electrically coupled to the second variable resistive element Rb in series, and controlled by the second search-line SLB. The source electrode of the second transistor Mcb and the source electrode of the first transistor Mca are connected together for receiving a common signal VVL. The charge control transistor Mml is electrically coupling to the match-line ML for controlling the voltage level of the match-line ML. The gate electrode of the charge control transistor Mml is electrically coupled to the source of the write transistor Mw the first variable resistive element Ra and the second variable resistive element Rb (indicated as a node NX).

Figure 5:
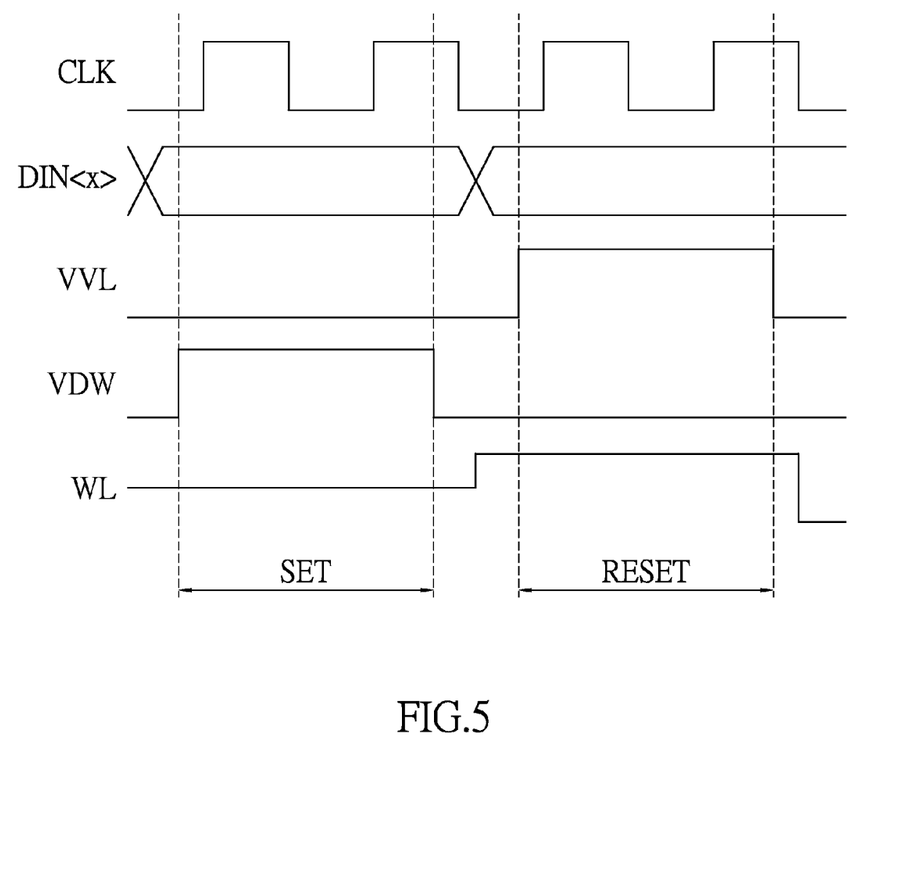
FIG. 5 shows a timing diagram of a 4T2R cell operating in the write phase according to an embodiment of the instant disclosure.

For a write phase which would be disclosed in FIG. 5, the first transistor Mca and the second transistor Mcb is turned-off to open the first variable resistive element Ra and the second variable resistive element Rb. For a search phase, the write transistor Mw is turned-off. When the 4T2R cell 31 operates in the search phase, the precharge transistor Mp pulls up the meach-line ML to a high voltage level VDD (which could be the bias voltage VDC minus the conducting resistance of the precharge transistor Mp) firstly, and then the precharge transistor Mp is turned-off. Next, a pulse voltage is applied across the gate electrode and the source electrode of the first transistor Mca for determining whether the gate voltage of the charge control transistor Mml changes larger than a match threshold during the period of the pulse, and the pulse voltage is applied across the gate electrode and the source electrode of the second transistor Mcb for determining whether the gate voltage of the charge control transistor changes Mml larger than the match threshold during the period of the pulse. In other words, the pulse voltage could be inputted to the source electrodes of the first transistor Mca and the second transistor Mcb, while the voltages of the gate electrodes of the first transistor Mca and the second transistor Mcb are controlled by the first search-line SL and the second search-line SLB respectively. Alternatively, the pulse voltage could be inputted to the gate electrodes of the first transistor Mca and the second transistor Mcb through the first search-line SL and the second search-line SLB respectively, while the voltages of the source electrodes of the first transistor Mca and the second transistor Mcb are constant. More specifically, the difference between the match threshold and a voltage VDIS applied to the source electrode of the charge control transistor Mml is the threshold voltage (Vt) of the charge control transistor Mml. The mentioned pulse voltage could be generated by two search methods described hereinafter.

When the first transistor Mca is turned-on, the variation of the gate voltage of the charge control transistor Mml is due to RC time constant of a RC circuit constituted of the first variable resistive element Ra and the parasitic capacitor of the first variable resistive element Ra, in which the parasitic capacitor is the capacitance across the node NX and the ground of the whole circuit. When the second transistor Mcb is turned-on, the variation of the gate voltage of the charge control transistor Mml is also due to RC time constant of a RC circuit constituted of the second variable resistive element Rb and the parasitic capacitor of the second variable resistive element Rb.

Figure 2B:
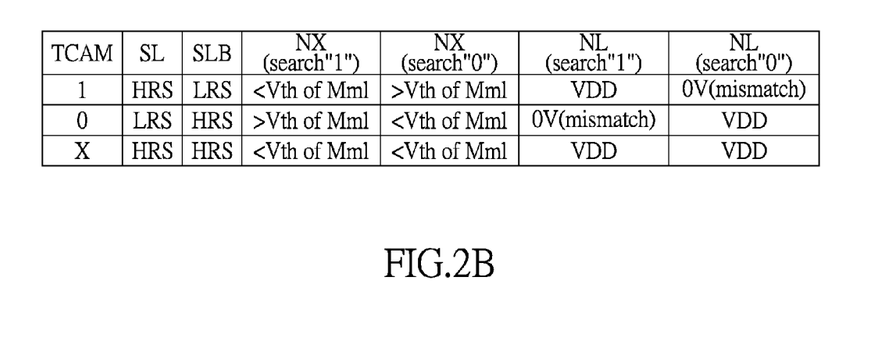
FIG. 2B illustrates a table showing the program states of the first variable resistive element and the second variable resistive element in the 4T2R cell according to an embodiment of the instant disclosure.

Please refer to FIG. 2A in conjunction with FIG. 2B. FIG. 2B illustrates a table showing the program states of the first variable resistive element and the second variable resistive element in the 4T2R cell according to an embodiment of the instant disclosure. In this embodiment, the bias voltage VDIS of the source electrode of the charge control transistor Mml is exemplary set to zero volt (0V). Thus, the match threshold corresponding to the threshold voltage Vt of the charge control transistor Mml is just the threshold voltage Vt. However, this shouldn't be the limitation to the instant disclosure. The first variable resistive element Ra and the second variable resistive element Rb both have a high resistance state HRS and a low resistance state LRS. The logic "1" is stored in the 4T2R cell 31 when the first variable resistive element Ra is at the high resistance state HRS and the second variable resistive element Rb is at the low resistance state LRS. The logic "0" is stored in the 4T2R cell 31 when the first variable resistive element Ra is at the low resistance state LRS and the second variable resistive element Rb is at the high resistance state HRS. The logic "X" is stored in the 4T2R cell 31 when the first variable resistive element Ra and the second variable resistive element Rb are both at the high resistance state HRS.

Figure 3:
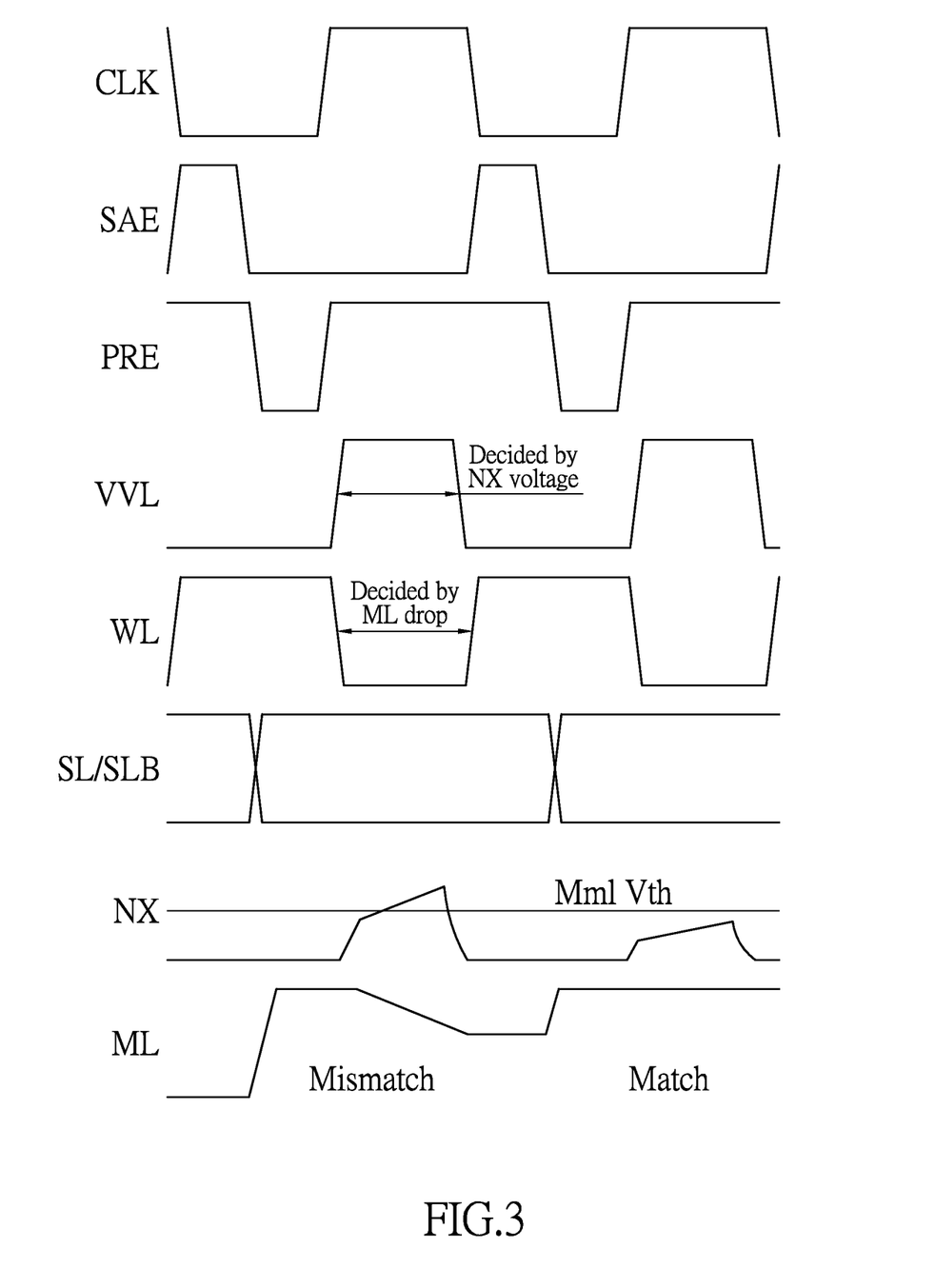
FIG. 3 shows a timing diagram of a 4T2R cell operating in the search phase according to an embodiment of the instant disclosure.

Please refer to FIG. 3 in conjunction with FIG. 2A and FIG. 2B. FIG. 3 shows a timing diagram of a 4T2R cell operating in the search phase according to an embodiment of the instant disclosure. The instant disclosure provides two methods to search the data stored in the 4T2R cell 31.

For the first search method, the pulse voltage referring to the waveform of the common signal VVL shown in FIG. 3 is inputted to the source electrodes of the first transistor Mca and the second transistor Mcb. In the search phase, the voltage difference between the gate electrode and the source electrode of the first transistor Mca is increased to be larger than the threshold voltage of the first transistor Mca for providing a first search path. Also, the voltage difference between the gate electrode and the source electrode of the second transistor Mcb is increased to be larger than the threshold voltage of the second transistor Mcb for providing a second search path. In order to distinguish the voltage variation at the node NX (which is the gate voltage of the charge control transistor Mml), the pulse width of the common signal VVL (or the width of the pulse voltage) is designed according to RC time constant of the RC circuit constituted by the first resistive element Ra, the second resistive element Rb and the related parasitic capacitor. Due to the resistance states (HRS or LRS) of the first variable resistive element Ra and the second variable resistive element Rb determined in the write phase of the 4T2R cell 31, the charge speed and/or discharge speed of the node NX would be different. More specifically, the pulse period (or width) is longer than the period of charging the gate voltage (node NX) of the charge control transistor Mml to the match threshold when the variable resistive element (Ra or Rb) in the search path is at the low resistance state LRS, but shorter than the period of charging the gate voltage of the charge control transistor Mml to the match threshold when the variable resistive element (Ra or Rb) in the search path is at the at the high resistance state HRS.

On condition that the logic "1" is stored in the 4T2R cell 31, the gate voltage of the charge control transistor Mml is changed to be less than the match threshold (threshold voltage Vt adding the bias voltage VDIS) during the pulse period due to RC-delay when the first search-line SL is at a high logic state ("1") and the second search-line SLB is at a low logic state ("0"). Thus, the voltage level of the match-line ML would be still at the high voltage level VDD indicating a match between the data being compared. In the same way, the gate voltage of the charge control transistor Mml is changed to be larger than the match threshold (which is the threshold voltage Vt when the bias voltage VDIS is 0V) during the pulse period due to RC-delay when the first search-line BL is at the low logic state ("0") and the second search-line SLB is at the high logic state ("1"). Thus, the voltage level of the match-line ML would be pulled down to a low voltage level (close to the bias voltage VDIS; e.g., close to 0V) indicating a mismatch between the data being compared. For the first search method, the voltage level of the first search-line SL and the second search-line SLB may be complementary, but the instant disclosure is not so restricted.

On condition that the logic "0" is stored in the 4T2R cell, the gate voltage of the charge control transistor Mml is changed to be larger than the match threshold during the pulse period due to RC-delay when the first search-line SL is at the high logic state ("1") and the second search-line SLB is at the low logic state ("0"). Thus, the voltage level of the match-line ML would be pulled down to a low voltage level (e.g., 0V) indicating a mismatch between the data being compared. In the same way, the gate voltage of the charge control transistor Mml is changed to be less than the match threshold during the pulse period due to RC-delay when the first search-line SL is at the low logic state ("0") and the second search-line SLB is at the high logic state ("1"). Thus, the voltage level of the match-line ML would be still at the high voltage level VDD indicating a match between the data being compared.

On condition that the logic "X" is stored in the 4T2R cell, the gate voltage of the charge control transistor Mml is changed to be less than the match threshold during the pulse period due to RC-delay when the first search-line SL is at the high logic state ("1") and the second search-line SLB is at the low logic state ("0"). Thus, the voltage level of the match-line ML would be still at the high voltage level VDD. The gate voltage of the charge control transistor Mml is changed to be less than the match threshold during the pulse period due to RC-delay when the first search-line SL is at the low logic state ("0") and the second search-line SLB is at the high logic state ("1"). Thus, the voltage level of the match-line ML would be still at the high voltage level VDD. After the search pulse, an enable signal SAE of is provided to the sense amplifier (SA) (not shown in the figure) connected to the match-line ML for output the match result. It is worth mentioning that when utilizing the first search method, the voltage at the node NX may be reset to zero volt before next search, thus the node NX could be discharged due to the reset process.

Figure 4:
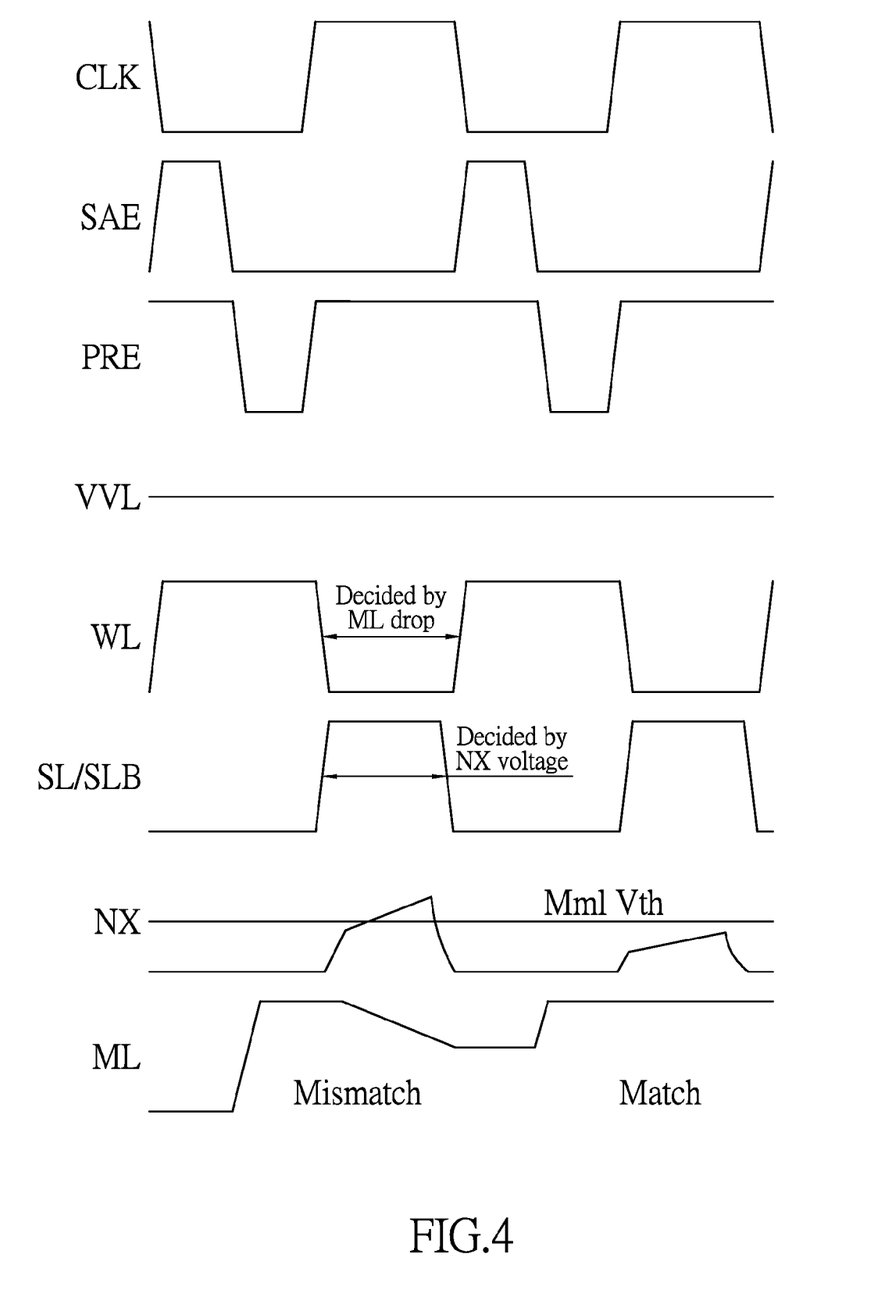
FIG. 4 shows a timing diagram of a 4T2R cell operating in the search phase according to another embodiment of the instant disclosure.

For the second search method, referring to FIG. 4 showing a timing diagram of a 4T2R cell operating in the search phase according to another embodiment of the instant disclosure. The pulse voltage is inputted to the gate electrode of the first transistor Mca or the gate electrode of the second transistor Mcb for turning on the first transistor Mca or the second transistor Mcb respectively. And, the common signal VVL is a constant voltage applied to the source electrodes of the first transistor Mca and the second transistor Mca. Similar to the first search method, the pulse voltage is applied across the gate electrode and the source electrode of the first transistor Mca (or the second transistor Mcb), the matching result is the same as the matching result of the first search method, thus the redundant information is not repeated. It is worth mentioning that when utilizing the second search method, the discharge path of the node NX is not provided by the first transistor Mca and the second transistor Mcb because the first transistor Mca and the second transistor Mcb is closed after the search pulse. Thus, an additional discharge path may be utilized to discharge the node NX before next search. However, the match margin of the storage cell could be larger, because the voltage difference of the first variable resistive element Ra and the second variable resistive element Rb caused by the search process is still maintained.

Additionally, when the 4T2R cell 31 operates in a write phase, two cycles are proceeded to write data, as shown in FIG. 5. The first cycle is for setting the first variable resistive element Ra or the second variable resistive element Rb to be the low resistance state LRS according to source data. The second cycle is for re-setting the first variable resistive element Ra or the second variable resistive element Rb to be the high resistance state HRS according to source data. An artisan of ordinary skill in the art will appreciate the implementation manner of writing data, thus there is no need to go into details.

According to above descriptions, the non-volatile ternary content-addressable memory 4T2R cell occupies smaller circuit (or chip) area compared to the conventional TCAM, and provides low current applying to the 4T2R cell to reduce read disturb. Different RC-delay of the first variable resistive element and the second variable resistive element controls the speed of the voltage change at the gate of the charge control transistor for matching.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A 4T2R cell for a non-volatile ternary content-addressable memory, the 4T2R cell comprising:
   a write transistor, controlled by a write-line, the drain electrode of the write transistor electrically coupled to a bias voltage;
   a first variable resistive element, electrically coupled to the source of the write transistor;
   a first transistor, electrically coupled to the first variable resistive element in series, controlled by a first search-line;
   a second variable resistive element, electrically coupled to the source of the write transistor;
   a second transistor, electrically coupled to the second variable resistive element in series, controlled by a second search-line, the source electrode of the second transistor and the source electrode of the first transistor being connected together; and
   a charge control transistor, electrically coupling to a match-line for controlling the voltage level of the match-line, the gate electrode of the charge control transistor electrically coupled to the source of the write transistor, the first variable resistive element and the second variable resistive element;
   wherein when the 4T2R cell operates in a search phase, a pulse voltage is applied across the gate electrode and the source electrode of the first transistor for determining whether the gate voltage of the charge control transistor changes larger than a match threshold during the period of the pulse, and the pulse voltage is applied across the gate electrode and the source electrode of the second transistor for determining whether the gate voltage of the charge control transistor changes larger than the match threshold during the period of the pulse.

2. The 4T2R cell according to claim 1, wherein the difference between the match threshold and a voltage applied to the source electrode of the charge control transistor is the threshold voltage of the charge control transistor.

3. The 4T2R cell according to claim 1, wherein the variation of the gate voltage of the charge control transistor is due to RC time constant of a RC circuit constituted of the first variable resistive element and the parasitic capacitor of the first variable resistive element, and is due to RC time constant of a RC circuit constituted of the second variable resistive element and the parasitic capacitor of the second variable resistive element.

4. The 4T2R cell according to claim 1, wherein when the pulse voltage is inputted to the source electrodes of the first transistor and the second transistor, the voltage difference between the gate electrode and the source electrode of the first transistor is increased to be larger than the threshold voltage of the first transistor, the voltage difference between the gate electrode and the source electrode of the second transistor is increased to be larger than the threshold voltage of the second transistor.

5. The 4T2R cell according to claim 1, wherein the pulse voltage is inputted to the gate electrode of the first transistor or the gate electrode of the second transistor for turning on the first transistor or the second transistor respectively, a constant voltage is applied to the source electrodes of the first transistor and the second transistor.

6. The 4T2R cell according to claim 1, wherein the first variable resistive element and the second variable resistive element are utilized as the phase change random-access memory (PCRAM), the resistive random-access memory (RRAM) or the magnetoresistive random-access memory (MRAM).

7. The 4T2R cell according to claim 6, wherein a logic "0", a logic "1" or a logic "X" (don't care) is stored in the 4T2R cell.

8. The 4T2R cell according to claim 7, wherein the first variable resistive element and the second variable resistive element both have a high resistance state and a low resistance state.

9. The 4T2R cell according to claim 8, the logic "1" is stored in the 4T2R cell when the first variable resistive element is at the high resistance state and the second variable resistive element is at the low resistance state, the logic "0" is stored in the 4T2R cell when the first variable resistive element is at the low resistance state and the second variable resistive element is at the high resistance state, the logic "X" is stored in the 4T2R cell when the first variable resistive element and the second variable resistive element are both at the high resistance state.

10. The 4T2R cell according to claim 9, wherein on condition that the logic "1" is stored in the 4T2R cell, the gate voltage of the charge control transistor is changed to be less than the match threshold during the pulse period due to RC-delay when the first search-line is at a high logic state and the second search-line is at a low logic state, the gate voltage of the charge control transistor is changed to be larger than the match threshold during the pulse period due to RC-delay when the first search-line is at the low logic state and the second search-line is at the high logic state.

11. The 4T2R cell according to claim 9, wherein on condition that the logic "0" is stored in the 4T2R cell, the gate voltage of the charge control transistor is changed to be larger than the match threshold during the pulse period due to RC-delay when the first search-line is at a high logic state and the second search-line is at a low logic state, the gate voltage of the charge control transistor is changed to be less than the match threshold during the pulse period due to RC-delay when the first search-line is at the low logic state and the second search-line is at the high logic state.

12. The 4T2R cell according to claim 9, wherein on condition that the logic "X" is stored in the 4T2R cell, the gate voltage of the charge control transistor is changed to be less than the match threshold during the pulse period due to RC-delay when the first search-line is at a high logic state and the second search-line is at a low logic state, the gate voltage of the charge control transistor is changed to be less than the match threshold during the pulse period due to RC-delay when the first search-line is at the low logic state and the second search-line is at the high logic state.

13. The 4T2R cell according to claim 1, wherein the write transistor, the first transistor, the second transistor, and the charge control transistor are N-channel MOSFETs.

14. A non-volatile ternary content-addressable memory comprising a plurality of 4T2R cells, each 4T2R cell comprising:
   a write transistor, controlled by a write-line, the drain electrode of the write transistor electrically coupled to a bias voltage;
   a first variable resistive element, electrically coupled to the source of the write transistor;
   a first transistor, electrically coupled to the first variable resistive element in series, controlled by a first search-line;
   a second variable resistive element, electrically coupled to the source of the write transistor;

a second transistor, electrically coupled to the second variable resistive element in series, controlled by a second search-line, the source electrode of the second transistor and the source electrode of the first transistor being connected together; and a charge control transistor, electrically coupling to a match-line for controlling the voltage level of the match-line, the gate electrode of the charge control transistor electrically coupled to the source of the write transistor, the first variable resistive element and the second variable resistive element;

wherein when the 4T2R cell operates in a search phase, a pulse voltage is applied across the gate electrode and the source electrode of the first transistor for determining whether the gate voltage of the charge control transistor changes larger than a match threshold during the period of the pulse, and the pulse voltage is applied across the gate electrode and the source electrode of the second transistor for determining whether the gate voltage of the charge control transistor changes larger than the match threshold during the period of the pulse.

15. The non-volatile ternary content-addressable memory according to claim 14, wherein the difference between the match threshold and a voltage applied to the source electrode of the charge control transistor is the threshold voltage of the charge control transistor.

16. The non-volatile ternary content-addressable memory according to claim 14, wherein the variation of the gate voltage of the charge control transistor is due to RC time constant of a RC circuit constituted of the first variable resistive element and the parasitic capacitor of the first variable resistive element, and is due to RC time constant of a RC circuit constituted of the second variable resistive element and the parasitic capacitor of the second variable resistive element.

17. The non-volatile ternary content-addressable memory according to claim 14, wherein when the pulse voltage is inputted to the source electrodes of the first transistor and the second transistor, the voltage difference between the gate electrode and the source electrode of the first transistor is increased to be larger than the threshold voltage of the first transistor, the voltage difference between the gate electrode and the source electrode of the second transistor is increased to be larger than the threshold voltage of the second transistor.

18. The non-volatile ternary content-addressable memory according to claim 14, wherein the pulse voltage is inputted to the gate electrode of the first transistor or the gate electrode of the second transistor to turn on the first transistor or the second transistor respectively, a constant voltage is applied to the source electrodes of the first transistor and the second transistor.

19. The non-volatile ternary content-addressable memory according to claim 14, wherein a logic "0", a logic "1" or a logic "X" (don't care) is stored in the 4T2R cell, the first variable resistive element and the second variable resistive element both have a high resistance state and a low resistance state.

20. The non-volatile ternary content-addressable memory according to claim 14, wherein the write transistor, the first transistor, the second transistor, and the charge control transistor are N-channel MOSFETs.

* * * * *